(12) United States Patent
Egerer et al.

(10) Patent No.: US 7,486,116 B2
(45) Date of Patent: Feb. 3, 2009

(54) DRIVER DEVICE, IN PARTICULAR FOR A SEMICONDUCTOR DEVICE, AND METHOD FOR OPERATING A DRIVER DEVICE

(75) Inventors: Jens Egerer, München (DE); Thomas Borst, Neubiberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/924,207

(22) Filed: Aug. 24, 2004

(65) Prior Publication Data

US 2005/0077929 A1   Apr. 14, 2005

(30) Foreign Application Priority Data

Aug. 25, 2003   (DE)   ............... 103 39 047

(51) Int. Cl.
*H03K 3/00*   (2006.01)
(52) U.S. Cl. ............... 327/108; 326/82; 326/27
(58) Field of Classification Search ............... None
See application file for complete search history.

(56) References Cited

U.S. PATENT DOCUMENTS

| 5,268,595 | A | * | 12/1993 | Ohshima | ............... | 327/77 |
|---|---|---|---|---|---|---|
| 5,345,422 | A | * | 9/1994 | Redwine | ............... | 365/189.09 |
| 5,581,206 | A | * | 12/1996 | Chevallier et al. | ............... | 327/143 |
| 5,929,668 | A | * | 7/1999 | Kim | ............... | 327/112 |
| 6,104,221 | A | * | 8/2000 | Hoon | ............... | 327/143 |
| 6,310,497 | B1 | * | 10/2001 | Strauss | ............... | 327/143 |
| 6,323,687 | B1 | * | 11/2001 | Yano | ............... | 326/83 |
| 6,605,967 | B2 | * | 8/2003 | Shougomori et al. | ............... | 327/108 |
| 6,744,300 | B2 | * | 6/2004 | Taguchi et al. | ............... | 327/530 |
| 2002/0075033 | A1 | | 6/2002 | Kato et al. | ............... | 326/17 |
| 2002/0180483 | A1 | | 12/2002 | Lim et al. | ............... | 326/83 |
| 2005/0017764 | A1 | * | 1/2005 | Feldtkeller | ............... | 327/108 |

FOREIGN PATENT DOCUMENTS

EP   0 606 727   7/1994

\* cited by examiner

*Primary Examiner*—Tuan T Lam
*Assistant Examiner*—Hiep Nguyen
(74) *Attorney, Agent, or Firm*—Slater & Matsil, L.L.P.

(57) ABSTRACT

The invention relates to a driver device and a method for operating a driver device in particular for a semiconductor device. The driver device includes a signal driver connected to a supply voltage. The driver device also includes a signal driver activating circuit section for activating a further signal driver when the supply voltage lies below a predetermined threshold value.

9 Claims, 2 Drawing Sheets

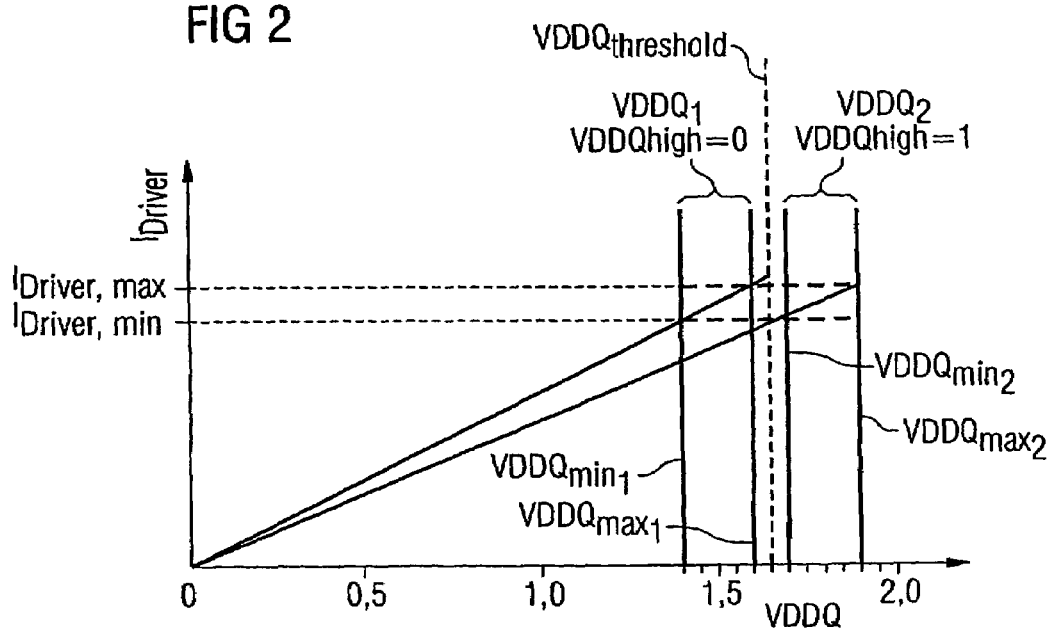

DRIVER DEVICE, IN PARTICULAR FOR A SEMICONDUCTOR DEVICE, AND METHOD FOR OPERATING A DRIVER DEVICE

CLAIM FOR PRIORITY

This application claims the benefit of priority to German Application No. 103 39 047.2, filed in the German language on Aug. 25, 2003, the contents of which are hereby incorporated by reference.

FIELD OF THE INVENTION

The invention relates to a driver device and to a method for operating a driver device.

DESCRIPTION OF THE RELATED ART

Semiconductor devices, e.g. appropriate, integrated (analog or digital) computing circuits, semiconductor memory devices such as functional memory devices (PLAs, PALs, etc.) and table memory devices (e.g. ROMs or RAMs, in particular SRAMs and DRAMs), etc. comprise—for outputting data at appropriate semiconductor device pins—a plurality of signal driver devices that are connected with the respective pins via appropriate pads.

Every driver device may, for instance, comprise a pull-up and a pull-down circuit means connected in series.

The pull-up circuit means is e.g. connected to an internal I/O supply voltage (Vddq) obtained from an external supply voltage (Vdd)—or e.g. directly to an external I/O supply voltage (Vddq)—and the pull-down circuit means is connected to the ground.

For outputting a "logic One", the pull-up circuit means may be switched on, i.e. be placed in a conductive state, and the pull-down circuit means may be switched off, i.e. be placed in a locked state—then, a "logically high" output signal will be output at an output pad connected between the pull-up and the pull-down circuit means.

Correspondingly, for outputting a "logic Zero", the pull-up circuit means is switched off, i.e. placed in a locked state, and the pull-down circuit means is switched on, i.e. placed in a conductive state, so that, correspondingly, a "logically low" output signal will be output at the output pad.

The pull-up and the pull-down circuit means may e.g. each comprise one or a plurality of transistors connected in parallel (e.g. the pull-up circuit means one or a plurality of p-channel MOSFETs and the pull-down circuit means one or a plurality of n-channel MOSFETs).

In the specification of the corresponding semiconductor device (in particular with devices destined for use in mobile terminals) there may be provided that the above-mentioned I/O supply voltage (Vddq) may comprise relatively strongly differing values (e.g.—with an external supply voltage Vdd of 1.8 V±100 mV—values varying e.g. between 1.5 V (±100 mV) and 1.8 V (±100 mV) (1.4 V ... 1.9 V)).

The driver intensity of the above-mentioned driver devices (i.e. the output signal current intensity obtained by the driver devices with a particular load applied) must—with particular ancillary conditions that are also specified (temperatures, voltages, etc.) lie within a particular range defined by the specification.

The larger the above-mentioned—admissible—variance of the I/O supply voltage (Vddq) is, the more difficult it will be to keep to the specified current driver intensities over the entire admitted I/O voltage supply range.

In particular with driver devices for high data rates can the driver device output impedance be adapted, during a test operation of the semiconductor device (i.e. in the scope of an appropriate test method), to the impedance of the signal line that is to be connected later on (or to the impedance of a reference resistor, respectively).

This may, for instance, be achieved by a varying number of transistors in the respective driver devices being placed, by means of a so-called laser-fuse-method from chip to chip (or from driver device to driver device, respectively) to an "enabled" state (i.e. are used for the driving of signals later on during the regular operation of the semiconductor device), or being left in a "non-enabled" state (i.e. are not used for the driving of signals later on during the regular operation of the semiconductor device) (so-called "trimming").

The performing of such a "trimming" method involves relatively high effort.

SUMMARY OF THE INVENTION

The invention, as shown in various embodiments, is a novel driver device, and a novel method for operating a driver device.

In some embodiments, a driver device, may include:
a signal driver connected to a supply voltage (VDDQ), and a signal driver activating circuit section for activating a further signal driver when the supply voltage (VDDQ) lies below a predetermined threshold value (VDDQ$_{threshold}$, VDDQ$_{threshold1}$).
a signal driver connected to a supply voltage (VDDQ), characterized in that the driver device additionally comprises:
means for activating a further signal driver when the supply voltage (VDDQ$_{threshold}$, VDDQ$_{threshold1}$).

By the (additional) activating of the further signal driver it can be achieved that—even with a relatively low level of the supply voltage—the driver intensity obtained by the driver device (i.e. the signal current intensity obtained by the driver device with a particular load applied) is sufficiently high.

BRIEF DESCRIPTION OF THE DRAWINGS

In the following, the invention will be explained in detail with reference to exemplary embodiments and the enclosed drawings. The drawings show:

FIG. 2 shows the current driver intensities (I$_{driver}$) obtained with the driver device illustrated in FIG. 1—with different values of the I/O supply voltage (Vddq).

DETAILED DESCRIPTION OF THE INVENTION

Figure 1:
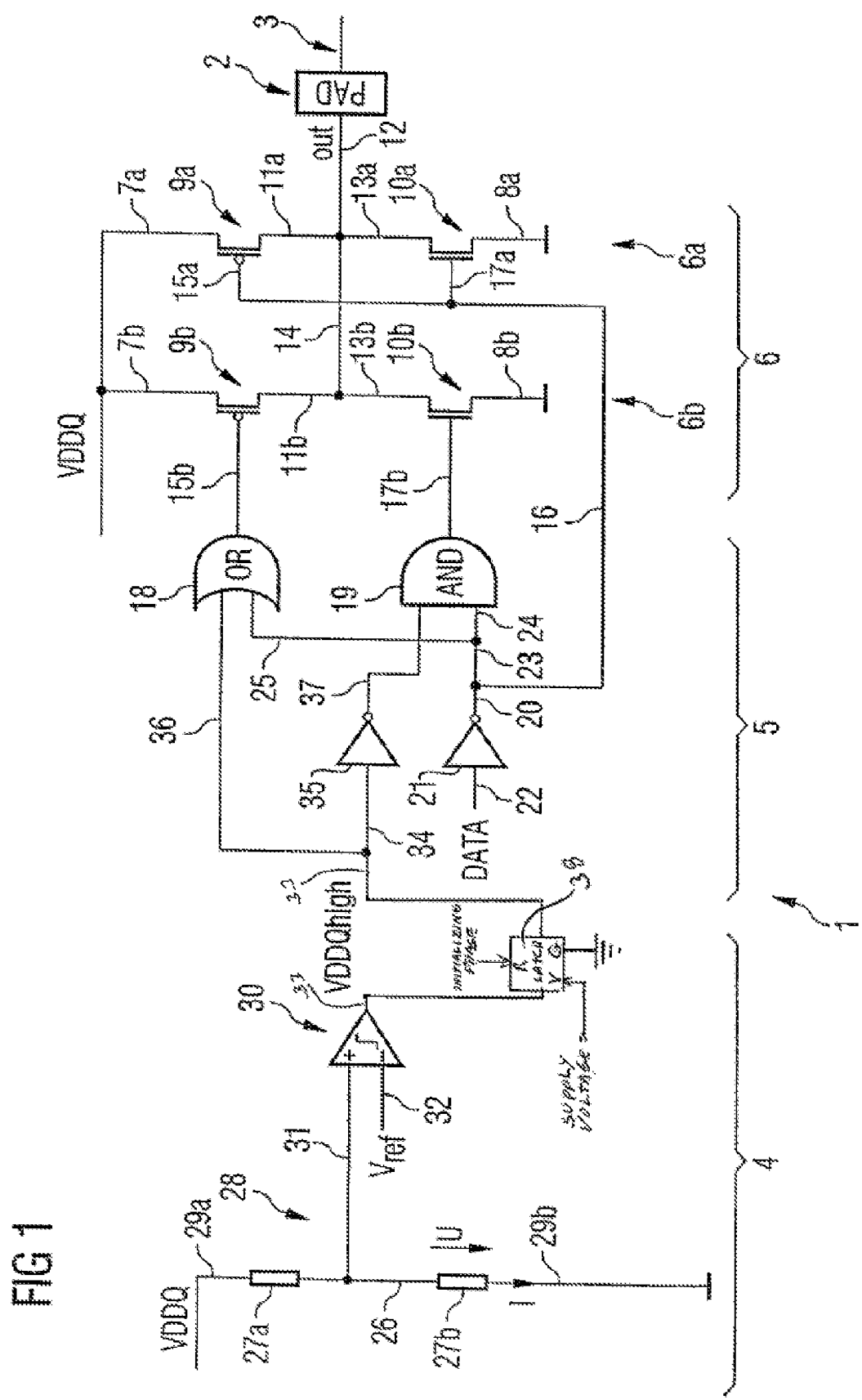
FIG. 1 shows a driver device 1 according to an embodiment of the present invention.

FIG. 1 a driver device 1 according to an embodiment of the present invention.

The driver device 1 may, for instance, be provided in an appropriate semiconductor device, e.g. an integrated (analog or digital) computing circuit, and/or a semiconductor memory device such as a functional memory device (PLA, PAL, etc.) or a table memory device (e.g. a ROM or RAM, in particular SRAM or DRAM), in particular in a semiconductor device destined to be used in mobile terminals (e.g. a mobile phone, a portable computer, etc.), in particular a DRAM.

Apart from the driver device 1 illustrated in FIG. 1, the corresponding semiconductor device may comprise a plurality of further driver devices which have, for instance, a correspondingly similar or identical construction to that of the driver device illustrated in FIG. 1. The driver devices 1 serve to output data (DATA) generated in the semiconductor device 1 to corresponding semiconductor device pins that are connected via corresponding lines 3 with corresponding pads 2 that are connected to the driver devices 1.

In another embodiment, the driver device 1 may include a voltage measuring circuit section 4, a signal driver activating circuit section 5, and a signal driver circuit section 6 with a first signal driver 6a that is continuously activated, or is activated at the first taking into operation already, or is activated during an initializing phase already, and—as will be explained in more detail in the following—a second signal driver 6b that is adapted to be additionally activated by the signal driver activating circuit section 5.

As results from FIG. 1, the first and the second signal drivers 6a, 6b are connected in parallel, and are each connected via appropriate lines 7a, 7b e.g. to an internal I/O supply voltage (Vddq) obtained e.g. from an external supply voltage (Vdd) by means of an appropriate voltage regulating device—or, preferably, alternatively directly to an external (I/O) supply voltage (Vddq)—, and via appropriate further lines 8a, 8b to the ground.

In the specification of the respective semiconductor device (in particular with a device destined to be used in mobile terminals) there may—correspondingly similar to conventional devices—be provided that the above-mentioned I/O supply voltage (Vddq) may comprise relatively strongly differing values lying within one single range (e.g.—with an external supply voltage Vdd of e.g. 1.8 V±100 mV—for instance values varying between 1.5 V (±100 mV) and 1.8 V (±100 mV) (1.4 V . . . 1.9 V), etc.).

Advantageously, there may, instead, also be provided in the specification of the respective semiconductor device—other than with conventional devices—that the above-mentioned I/O supply voltage (Vddq) may lie within several, different (e.g. two) ranges that are not overlapping each other and/or are not adjacent to each other (here e.g.—as is illustrated in FIG. 2—either within a first I/O supply voltage range Vddq1=1.5 V (±100 mV) (1.4 V . . . 1.6 V, or between $Vddq_{min1}$ (here: 1.4 V), and $Vddq_{max1}$ (here: 1.6 V)), or within a—different—second I/O supply voltage range Vddq2=1.8 V (±100 mV) (1.7 V . . . 1.9 V, or between $Vddq_{min2}$ (here: 1.7 V), and $Vddq_{max2}$ (here: 1.9 V))).

In the semiconductor device there may, for instance, be provided either a voltage regulating means that generates, from the external supply voltage Vdd, an I/O supply voltage Vddq lying within the first I/O supply voltage range Vddq1, or e.g. a voltage regulating means—differing therefrom—that generates, from the external supply voltage Vdd, an I/O supply voltage Vddq lying within the second I/O supply voltage range Vddq2 (or e.g. a voltage regulating means that is adapted to generate—optionally—an I/O supply voltage Vddq lying either within the first or within the second I/O supply voltage range Vddq1, Vddq2). Alternatively, (in a preferred embodiment) such a voltage regulating means may be renounced (i.e. the signal drivers 6a, 6b may be directly connected to the external supply voltage Vddq).

Each signal driver 6a, 6b comprises a pull-up circuit means 9a, 9b—connected via the above-mentioned lines 7a or 7b, respectively, to the I/O supply voltage (Vddq)—, and a pull-down circuit means 10a, 10b—connected via the above-mentioned lines 8a or 8b, respectively, to the ground.

In the present—simplified—embodiment, the pull-up circuit means 9a, 9b each comprise only one single transistor (here: a p-channel MOSFET), wherein the source of the corresponding p-channel MOSFET 9a or 9b, respectively, is connected—via the above-mentioned lines 7a or 7b, respectively—to the I/O supply voltage (Vddq).

In further embodiments that are not illustrated here, a plurality of transistors—connected in parallel—may instead also be provided in the pull-up circuit means 9a, 9b (e.g. a plurality of p-channel MOSFETs connected in parallel).

Correspondingly, in the present—simplified—embodiment, the pull-down circuit means 10a, 10b also each comprise only one single transistor (here: a n-channel MOSFET), wherein the source of the corresponding n-channel MOSFET 10a or 10b, respectively, is—via the above-mentioned lines 8a or 8b, respectively—connected to the ground.

In further embodiments that are not illustrated here, a plurality of transistors—connected in parallel—may instead also be provided in the pull-down circuit means 10a, 10b (e.g. a plurality of n-channel MOSFETs connected in parallel).

As results from FIG. 1, the pull-up circuit means 9a (or the drain of the corresponding MOSFET 9a, respectively) is connected, via a line 11a and a line 13a connected thereto, to the pull-down circuit means 10a (or the drain of the corresponding MOSFET 10a, respectively).

The lines 11a, 13a—and hence also the pull-up and the pull-down circuit means 9a, 10a—are connected via a line 12 to the above-mentioned (output) pad 2 that is connected to a corresponding pin via the line 3.

Furthermore, the pull-up circuit means 9b (or the drain of the corresponding MOSFET 9b, respectively) is connected, via a line 11b and a line 13b connected thereto, to the pull-down circuit means 10b (or the drain of the corresponding MOSFET 10b, respectively).

The lines 11b, 13b—and hence also the pull-up and the pull-down circuit means 9b, 10b—are connected (in parallel to the pull-up and pull-down circuits 9a, 10a), via a line 14 that is connected to the line 12, to the above-mentioned (output) pad 2.

A control connection of the pull-up circuit means 9a (or the gate of the corresponding MOSFET 9a, respectively) is connected via a line 15a to a line 16 with which—via a line 17a—a control connection of the pull-down circuit means 10a (or the gate of the corresponding MOSFET 10a, respectively) is also connected.

As results further from FIG. 1, a control connection of the pull-up circuit means 9b (or the gate of the corresponding MOSFET 9b, respectively) is connected via a line 15b to an output of an OR-gate 18 of the signal driver activating circuit section 5, and a control connection of the pull-down circuit means 10b (or the gate of the corresponding MOSFET 10b, respectively) is connected via a line 17b to an output of an AND-gate 19 of the signal driver activating circuit section 5.

The line 16—that is connected with the control connections of the circuit means 9a, 10a—is connected via a line 20 to the output of an inverter 21, the input of which is connected with a line 22 to which the data (DATA) to be output by the driver device 1 are applied. The output of the inverter 21 is additionally—via the above-mentioned line 20 and the lines 23, 24—connected to an input of the AND-gate 19, and—via the above-mentioned lines 20, 23, and a line 25—to an input of the OR-gate 18.

As results further from FIG. 1, the voltage measuring circuit section 4 comprises a voltage divider circuit 28 consisting of two resistors 27a, 27b connected with one another in series via a line 26, and having a relatively high ohmic resistance.

The resistor 27b is connected to the ground via a line 29b, and the resistor 27a is, via a line 29, connected to the I/O supply voltage (Vddq) (to which, as already mentioned above, the signal drivers 6a, 6b are also connected).

The line 26 that connects the two resistors 27a, 27b with one another is connected to a PLUS input of a comparator 30 via a line 31.

The MINUS input of the comparator 30 is connected to a line 32 at which—as will be explained in more detail further below—a reference voltage (Vref) is applied.

The output signal VDDQhigh (which is, as will be explained in more detail in the following, either "logically high" or "logically low", depending on the respective intensity of the I/O supply voltage (Vddq)) that is output at the output of the comparator is supplied to an input of a (further) inverter 35 via a line 33 and a line 34, and to a (further) input of the above-mentioned OR-gate 18 via the line 33 and a line 36 connected therewith.

As results further from FIG. 1, the output of the inverter 35 is connected with a (further) input of the AND-gate 19 via a line 37.

As will be explained in more detail in the following, the first signal driver 6a remains—irrespective of the intensity of the I/O supply voltage (Vddq)—continuously in an activated state (i.e. is used for driving the data (DATA) applied at the line 22).

Compared with this, the second signal driver 6b is, when the intensity of the I/O supply voltage (Vddq) lies above a predetermined threshold value ($Vddq_{threshold}$), (still) deactivated (i.e. is not used for driving the data (DATA) applied at the line 22), and is only (additionally) activated (i.e. used for driving the data (DATA) applied at the line 22) by the signal driver activating circuit section 5 when the intensity of the I/O supply voltage (Vddq) lies below the above-mentioned predetermined threshold value ($Vddq_{threshold}$).

The threshold value ($Vddq_{threshold}$) may, for instance, be selected such that it lies in the middle between the above-mentioned two voltage ranges for the I/O supply voltage (Vddq) that may be used or are specified, respectively, for one and the same device (here e.g.—as is illustrated in FIG. 2—at $Vddq_{threshold}$=1.65 V (i.e. in the middle between the two I/O supply voltage ranges Vddq1=1.5 V (±100 mV) (1.4 V . . . 1.6 V), and Vddq2=1.8 V (±100 mV) (1.7 V . . . 1.9 V) that are used here), or e.g.—with only one single, specified, admitted voltage range for the I/O supply voltage (Vddq) in the middle thereof (e.g. with an I/O supply voltage (Vddq) varying between 1.5 V (±100 mV) and 1.8 V (±100 mV) (1.4 V . . . 1.9 V) also at 1.65 V)).

With a relatively high I/O supply voltage (Vddq)—lying above the above-mentioned threshold value ($Vddq_{threshold}$) (here: 1.65 V)—a relatively high current I will flow through the resistors 27a, 27b of the voltage divider circuit 28 illustrated in FIG. 1, so that a—relatively high—voltage U will drop across the resistor 27b.

The voltage U dropping across the resistor 27b is compared in the comparator 30 with the reference voltage (Vref) applied at the line 32.

The reference voltage (Vref) is selected such that, when the I/O supply voltage (Vddq) lies above the above-mentioned threshold value ($Vddq_{threshold}$) (here: 1.65 V), the voltage U dropping across the resistor 27b is higher than the reference voltage (Vref), and when the I/O supply voltage (Vddq) lies below the above-mentioned threshold value ($Vddq_{threshold}$) (here: 1.65 V), the voltage U dropping across the resistor 27b is lower than the reference voltage (Vref) (for instance, when the resistors 27a and 27b are equal, the reference voltage (Vref) may be selected to be half as high as the above-mentioned voltage threshold value ($Vddq_{threshold}$) (e.g. may be 0.825 V)).

When the voltage U dropping across the resistor 27b is higher than the reference voltage (Vref) (i.e. when the I/O supply voltage (Vddq) is higher than the above-mentioned threshold value ($Vddq_{threshold}$) (here: higher than 1.65 V)), a "logically high" output signal is output by the comparator 30 at the line 33 and is transmitted via the line 36 to the OR-gate 18, and via the line 34 to the inverter 35.

By the inverter 35, the "logically high" output signal VDDQhigh is inverted, so that a "logically low" signal is output by the inverter 35 at the line 37 and is transmitted to the AND-gate 19.

Due to the "logically low" signal applied at the line 37, the AND-gate 19 outputs a "logically low" signal at the line 17b (and thus at the gate of the transistor 10b) (irrespective of the (data) signals (DATA) applied at the lines 20, 23, 24—or the line 22, respectively).

Due to the "logically low" signal applied at the line 17b, the transistor 10b remains (irrespective of the (data) signals (DATA signals) applied at the lines 20, 23, 24—or the line 22, respectively—switched off, i.e. locked (and thus the signal driver 6b deactivated).

Furthermore—due to the "logically high" signal applied at the line 36, as explained above—a "logically high" signal is also output by the OR-gate 18 at the line 15b (and thus at the gate of the transistor 9b) (irrespective of the (data) signals (DATA) applied at the lines 20, 23, 24—or the line 22, respectively).

Due to the "logically high" signal applied at the line 15b, the transistor 9b remains (irrespective of the (data) signals (DATA signals) applied at the lines 20, 23, 24—or the line 22, respectively) switched off, i.e. locked (and thus the signal driver 6b deactivated).

If a "logically low" signal (DATA signal) to be output by the driver device 1 is applied at the line 22, an inverted, "logically high" signal is output by the inverter 21, and output via the lines 20, 16, 17a or 15a, respectively, to the gate of the transistor 10a and to the gate of the transistor 9a.

Due to the "logically high" signal applied at the (control) line 17a and the (control) line 15a (or the gate of the transistor 10a and the gate of the transistor 9a, respectively), the transistor 10a is switched on, i.e. becomes conductive, and the transistor 9a is switched off, i.e. is locked, and hence a "logically low" signal (i.e. a "logic Zero") is output by the signal driver 6a at the line 12 (and thus at the (output) pad 2).

If the signal (DATA signal) applied at the line 22 and to be output by the driver device 1 changes its state from "logically low" to "logically high", a "logically low" signal (as an inverted output signal) is output by the inverter 21, and is output via the lines 20, 16, 17a or 15a, respectively, to the gate of the transistor 10a, and the gate of the transistor 9a.

Due to the "logically low" signal applied at the (control) line 17a and the (control) line 15a (or the gate of the transistor 10a and the gate of the transistor 9a, respectively), the transistor 10a is switched off, i.e. is locked, and the transistor 9a is switched on, i.e. is becomes conductive, and hence a "logically high" signal (i.e. a "logic One") is output by the signal driver 6a at the line 12 (and thus at the (output) pad 2).

If the I/O supply voltage (Vddq) is lower than the above-mentioned threshold value ($Vddq_{threshold}$) (or lower than/equal to the threshold value) (here: lower or lower than/equal to 1.65 V), the corresponding signals (DATA signals) are—except by the signal driver 6a (or by the pull-up or pull-down circuit means (transistors) 9a, 10a, respectively)—additionally also output by the signal driver 6b (or the pull-up or pull-down circuit means (transistors) 9b, 10b, respectively) (i.e.—in addition to the signal driver 6a—the signal driver 6b is also activated).

If the I/O supply voltage (Vddq) is lower than the above-mentioned threshold value ($Vddq_{threshold}$) (or lower than/ equal to the threshold value), the voltage U dropping across the resistor 27b is lower than the reference voltage (Vref) (or lower than/equal to the reference voltage, respectively).

A "logically low" output signal VDDQhigh is then output by the comparator 30 at the line 33 and transmitted via the line 36 to the OR-gate 18, and via the line 34 to the inverter 35.

The "logically low" output signal VDDQhigh is inverted by the inverter 35, so that a "logically high" signal is output by the inverter 35 at the line 37, and is transmitted to the AND-gate 19.

Due to the "logically high" signal applied at the line 37, the AND-gate 19 outputs at the line 17b (and thus at the gate of the transistor 10b)—irrespective of the (data) signals (DATA) applied at the lines 20, 23, 24 (or the line 22, respectively)—either a "logically high" or a "logically low" signal (and thus the signal driver 6b is activated).

Furthermore—due to the "logically low" signal applied at the line 36, as explained above—the OR-gate 18 outputs at the line 15b (and thus at the gate of the transistor 9b)—depending on the (data) signals (DATA) applied at the lines 20, 23, 24 (or the line 22, respectively) (and correspondingly similar to the NAND-gate 19)—either a "logically high" or a "logically low" signal (and thus the signal driver 6b is activated).

If a "logically low" signal (DATA signal) to be output by the driver device 1 is applied at the line 22, an inverted, "logically high" signal is output by the inverter 21 and output via the lines 20, 16, 17a or 15a, respectively, to the gate of the transistor 10a, and to the gate of the transistor 9a, and via the lines 20, 23, 24 to the AND-gate 19, and via the lines 20, 23, 25 to the OR-gate 18.

The AND-gate 19 and the OR-gate 18 then output (due to the "logically high" signal applied at the line 37 or the "logically low" signal applied at the line 36, respectively) the corresponding "logically high" signals applied at the lines 24 or 25, respectively, at the lines 15b or 17b, respectively (at the gate of the transistor 9b and at the gate of the transistor 10b, there will then—also—be a "logically high" signal).

Due to the "logically high" signals applied at the (control) lines 17a, 15a of the first signal driver 6a, and the (control) lines 17b, 15b of the second signal driver 6b (or the gates of the transistors 10a and 9a of the first signal driver 6a, and the gates of the transistors 10b, 9b of the second signal driver 6b, respectively), the transistor 10a of the first signal driver 6a and the—corresponding—transistor 10b of the second signal driver 6b are switched on, i.e. become conductive.

Furthermore—also due to the "logically high" signals applied at the (control) lines 17a, 15a of the first signal driver 6a, and the (control) lines 17b, 15b of the second signal driver 6b (or the gates of the transistors 10a and 9a of the first signal driver 6a, and the gates of the transistors 10b, 9b of the second signal driver 6b, respectively)—the transistor 9a of the first signal driver 6a and the—corresponding—transistor 9b of the second signal driver 6b are switched off, i.e. are locked.

Thus, a "logically low" signal (i.e. a "logic Zero") is output at the line 12 (and thus at the (output) pad 2) both by the first signal driver 6a and by the second signal driver 6b.

If the signal (DATA signal) applied at the line 22 and to be output by the driver device 1 changes its state from "logically low" to "logically high", a "logically low" signal (as an inverted output signal) is output by the inverter 21, and is output via the lines 20, 16, 17a or 15a, respectively, to the gate of the transistor 10a, and to the gate of the transistor 9a, and via the lines 20, 23, 24 to the AND-gate 19, and via the lines 20, 23, 25 to the OR-gate 18.

The AND-gate 19 and the OR-gate 18 then output (due to the "logically high" signal applied at the line 37 or the "logically low" signal applied at the line 36, respectively), the corresponding "logically low" signals applied at the lines 24 or 25, respectively, at the lines 15b or 17b, respectively (at the gate of the transistor 9b and at the gate of the transistor 10b, there will then—also—be a "logically low" signal).

Due to the "logically low" signals applied at the (control) lines 17a, 15a of the first signal driver 6a and the (control) lines 17b, 15b of the second signal driver 6b (or the gates of the transistors 10a and 9a of the first signal driver 6a, and the gates of the transistors 10b, 9b of the second signal driver 6b), the transistor 10a of the first signal driver 6a and the—corresponding—transistor 10b of the second signal driver 6b are switched off, i.e. are locked.

Furthermore—also due to the "logically low" signals applied at the (control) lines 17a, 15a of the first signal driver 6a and the (control) lines 17b, 15b of the second signal driver 6b (or the gates of the transistors 10a and 9a of the first signal driver 6a, and the gates of the transistors 10b, 9b of the second signal driver 6b)—the transistor 9a of the first signal driver 6a and the—corresponding—transistor 9b of the second signal driver 6b are switched on, i.e. become conductive.

Thus, a "logically high" signal (i.e. a "logic One") is output at the line 12 (and thus at the (output) pad 2) both by the first signal driver 6a and by the second signal driver 6b.

By the additional activating of the second signal driver 6b it can be ensured (as is illustrated in FIG. 2) that—even with a relatively low intensity of the I/O supply voltage (Vddq) (e.g. with an I/O supply voltage (Vddq) lying in the above-mentioned lower I/O supply voltage range Vddq1=1.5 V (±100 mV) (1.4 V . . . 1.6 V)—the driver intensity $I_{Driver}$ obtained by the driver device 1 (i.e. the output signal current intensity $I_{Driver}$ obtained—with a particular load applied—by the driver device 1) lies within the range determined by the respective specification (here e.g.: between $I_{Driver,\ min}$ and $I_{Driver,\ max}$).

To this end, there may—additionally—be provided that the (output) transistors 9b, 10b of the—additionally activated—signal driver 6b have, for instance, correspondingly larger transistor widths and/or correspondingly larger transistor digit numbers, etc. than the (output) transistors 9a, 10a of the—continuously activated—first signal driver 6a. This renders it possible to optimize the driver intensity of the driver device 1 for each specified I/O supply voltage range Vddq1, Vddq2 separately.

The adjusting of the driver intensity by means of a trimming method (in particular e.g. the—final—enabling or disabling of corresponding signal drivers by means of so-called laser fuses during the production of the corresponding semiconductor device) can advantageously be renounced (i.e. simple signal drivers 6a, 6b—not adapted to be calibrated from outside—can be used); alternatively or additionally, e.g. a trimming or calibration with an or to an external resistance to be performed during the operation of the semiconductor device (e.g. for adapting the output resistance to the respective line resistance) may also be renounced, etc.

In the specification of the respective semiconductor device there may, for instance, also be provided alternatively to the above-explained embodiment that the above-mentioned I/O supply voltage (Vddq) may lie within more than two, e.g. within n=3, 4 or more, different ranges that are not overlapping each other and/or not adjacent to each other, and/or a plurality (in particular n–1) different threshold values—in particular each lying in the middle between adjacent ranges for the I/O supply voltage (Vddq)—may be used (e.g. n–1=2, 3 or more different threshold values $Vddq_{threshold,\ 1}$, $Vddq_{threshold,\ 2}$, $Vddq_{threshold,\ 3}$, etc. (and e.g. a correspondingly higher number (e.g. n–1) of comparators and/or a correspondingly higher number (e.g. n−1) of signal drivers that are adapted to be additionally enabled or activated with lower values of the I/O supply voltage (Vddq) (wherein the more signal drivers (with e.g. in particular ever larger widths and/or digit numbers each) are activated, the lower the I/O supply voltage (Vddq) is)).

Advantageously, the above-described determination of the intensity of the I/O supply voltage (Vddq) and—with low (or high) values of the I/O supply voltage (vddq)—the corresponding enabling/activating (or disabling/deactivating) of the second (or corresponding further) signal driver(s) 6b, etc. is only performed during an initializing phase of the corresponding semiconductor device as indicated by resetting the latch circuit 38 of FIG. 1 at the initializing phase—e.g. before corresponding (useful) data are for the first time stored in the semiconductor device (so that—after the initializing phase—the number of the signal drivers used remains equal even if—after the initializing phase, i.e. during the regular operation of the semiconductor device—the I/O supply voltage (Vddq) should be subject to corresponding fluctuations).

Alternatively or additionally, the above-described determination of the intensity of the I/O supply voltage (Vddq), and the corresponding activating/de-activating of the signal driver(s) can—in particular during the regular operation of the semiconductor device—e.g. also be performed at predetermined times or within predetermined periods only (e.g. not at times or periods at which corresponding (useful) data are input in and/or output from the semiconductor device, etc.).

By that, it can be avoided that voltage fluctuations that possibly may occur result in a corresponding activating or deactivating of the signal driver(s).

LIST OF REFERENCE SIGNS 1 driver device
2 pad
3 line
4 voltage measuring circuit section
5 signal driver activating circuit section
6 signal driver circuit section
6a signal driver
6b signal driver
7a line
7b line
8a line
8b line
9a pull-up circuit means
9b pull-up circuit means
10a pull-down circuit means
10b pull-down circuit means
11a line
11b line
12 line
13a line
13b line
14 line
15a line
15b line
16 line
17a line
17b line
18 OR-gate
19 AND-gate
20 line
21 inverter
22 line
23 line
24 line
25 line
26 line
27a resistor
27b resistor
28 voltage divider circuit
29a line
29b line
30 comparator
31 line
32 line
33 line
34 line
35 inverter
36 line
37 line

The invention claimed is:

1. A semiconductor device, comprising:
a driver device having a first signal driver connected to a semiconductor device supply voltage and a second signal driver, the first and second signal drivers each comprising a pull-up transistor and a pull-down transistor, the first and second signal drivers adapted to jointly drive an output digital signal stream of data on a line connected to the first and second signal drivers;
a signal driver control circuit section, said control circuit section enabling the second signal driver during an initializing phase of the semiconductor device when a voltage representation of the supply voltage is below a predetermined reference value, and disabling the second signal driver during the initializing phase of the semiconductor device when said representation of the supply voltage is above the predetermined reference value;
wherein when the second signal driver is enabled, both the first and second signal drivers continuously and jointly drive the output signal, and when the second signal driver is disabled only the first signal driver drives the output signal; and
wherein when the second signal driver is set to one of said enabled or disabled condition in the initializing phase, the second signal driver is maintained in said set enabled or disabled condition during a subsequent regular operational phase of the semiconductor device regardless of the value of the supply voltage.

2. The driver device according to claim 1, wherein said driver device further comprises a voltage measuring circuit section for determining whether the supply voltage lies below the predetermined threshold value.

3. The driver device according to claim 1, wherein the supply voltage lies in a first predetermined range or in a second predetermined range.

4. The driver device according to claim 3, wherein the first predetermined range and the second predetermined range do not overlap.

5. The driver device according to claim 3, wherein the predetermined threshold value lies between the first predetermined range and the second predetermined range.

6. A method for operating a semiconductor device, comprising:
connecting a first signal driver and a second signal driver to a semiconductor device supply voltage, the first and second signal drivers each comprising a pull-up transistor and a pull-down transistor, the first and second signal drivers adapted to jointly drive an output digital signal stream of data on a line connected to the first and second signal drivers;

setting the second signal driver during an initializing phase of the semiconductor device to an enabled condition when a voltage representative of the supply voltage has a value that is below a predetermined reference value;

setting the second signal driver during the initializing phase of the semiconductor device to a disabled condition when said voltage representative of the supply voltage has a value that is above the predetermined reference value;

wherein when the second signal driver is enabled, both the first and second signal drivers continuously and jointly drive the output signal, and when the second driver is disabled only the first signal driver drives the output signal; and wherein when the second signal driver is set to one of said enabled or disabled condition in the initializing phase, the second signal driver is maintained in said set enabled or disabled condition in a subsequent regular operational phase of the semiconductor device regardless of the value of the supply voltage.

7. The method as in claim 6, wherein the supply voltage lies in a first predetermined range or in a second predetermined range.

8. The method as in claim 7, wherein the first predetermined range and the second predetermined range do not overlap.

9. The method as in claim 8, wherein the predetermined threshold value lies between the first predetermined range and the second predetermined range.

* * * * *